United States Patent
Wang et al.

(10) Patent No.: US 9,659,791 B2
(45) Date of Patent: May 23, 2017

(54) METAL REMOVAL WITH REDUCED SURFACE ROUGHNESS

(71) Applicant: Applied Materials, Inc., Santa Clara, CA (US)

(72) Inventors: Xikun Wang, Sunnyvale, CA (US); David Cui, San Jose, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/801,542

(22) Filed: Jul. 16, 2015

(65) Prior Publication Data
US 2017/0018439 A1    Jan. 19, 2017

(51) Int. Cl.
| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *C23F 3/00* | (2006.01) |
| *H01L 21/3213* | (2006.01) |
| *H01L 21/768* | (2006.01) |

(Continued)

(52) U.S. Cl.
CPC .. *H01L 21/32138* (2013.01); *H01L 21/02071* (2013.01); *H01L 21/3065* (2013.01); *H01L 21/31122* (2013.01); *H01L 21/32135* (2013.01); *H01L 21/32136* (2013.01); *H01L 21/7684* (2013.01)

(58) Field of Classification Search
None
See application file for complete search history.

(56) References Cited

U.S. PATENT DOCUMENTS

| | | | |
|---|---|---|---|
| 8,211,808 B2 | 7/2012 | Sapre et al. | |
| 8,435,902 B2 | 5/2013 | Tang et al. | |

(Continued)

FOREIGN PATENT DOCUMENTS

| | | |
|---|---|---|
| CN | 102820224 A | 12/2012 |
| CN | 103681242 A | 3/2014 |
| CN | 104018157 A | 9/2014 |

*Primary Examiner* — Stephanie Duclair
(74) *Attorney, Agent, or Firm* — Kilpatrick Townsend & Stockton LLP

(57) ABSTRACT

Methods are described for etching metal layers that are difficult to volatize, such as cobalt, nickel, and platinum to form an etched metal layer with reduced surface roughness. The methods include pretreating the metal layer with a local plasma formed from a hydrogen-containing precursor. The pretreated metal layer is then reacted with a halogen-containing precursor to form a halogenated metal layer having a halogenated etch product. A carbon-and-nitrogen-containing precursor reacts with the halogenated etch product to form a volatile etch product that can be removed in the gas phase from the etched surface of the metal layer. The surface roughness may be reduced by performing one or more plasma treatments on the etching metal layer after a plurality of etching sequences. Surface roughness is also reduced by controlling the temperature and length of time the metal layer is reacting with the etchant precursors.

20 Claims, 6 Drawing Sheets

(51) Int. Cl.
    *H01L 21/02*     (2006.01)
    *H01L 21/311*     (2006.01)
    *H01L 21/3065*     (2006.01)

(56) References Cited

U.S. PATENT DOCUMENTS

| | | |
|---|---|---|
| 8,642,481 B2 | 2/2014 | Wang et al. |
| 2009/0104782 A1 | 4/2009 | Lu et al. |
| 2011/0053380 A1 | 3/2011 | Sapre et al. |
| 2011/0266252 A1 | 11/2011 | Thadani |
| 2011/0294300 A1 | 12/2011 | Zhang et al. |
| 2012/0211462 A1 | 8/2012 | Zhang et al. |
| 2013/0052827 A1 | 2/2013 | Wang et al. |
| 2013/0059440 A1 | 3/2013 | Wang et al. |
| 2014/0154889 A1* | 6/2014 | Wang ................ H01L 21/32136 438/720 |
| 2014/0251953 A1 | 9/2014 | Winkler |
| 2014/0251954 A1 | 9/2014 | Winkler |
| 2014/0273492 A1* | 9/2014 | Anthis .............. H01L 21/32135 438/720 |
| 2014/0308816 A1 | 10/2014 | Wang et al. |
| 2015/0129546 A1 | 5/2015 | Ingle et al. |
| 2015/0170935 A1 | 6/2015 | Wang et al. |
| 2015/0206764 A1 | 7/2015 | Wang et al. |
| 2015/0262829 A1 | 9/2015 | Park et al. |
| 2015/0345028 A1* | 12/2015 | Wang ........................ C23F 1/12 216/67 |

\* cited by examiner

METAL REMOVAL WITH REDUCED SURFACE ROUGHNESS

FIELD

Dry etch processes for metal etching on semiconductor substrates.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in a photoresist onto underlying layers, thinning layers or thinning lateral dimensions of features already present on the surface. Often it is desirable to have a "selective" etch process that etches one material faster than another on the substrate surface. Such etch processes are said to be selective to the first material relative to another material because they etch the first material at a significantly faster rate. Selective etch processes have been developed for a variety of materials.

Etch processes may be performed by contacting the substrate with liquid, gaseous, and/or plasma etchants. Etch processes that do not have liquid etchants in direct contact with the substrate are commonly referred to as "dry etch processes." Dry etch processes are often desirable for selective etch processes that form delicate nano-scale patterns in a semiconductor substrate because of the precise control of an etch stop and low impact on patterned features. For example, dry etch processes can be stopped rapidly by evacuating the substrate processing region and/or purging it with an inert gas. In contrast, wet etch processes that leave residual liquid etchants on exposed substrate surfaces are prone to over-etching a target material.

Some selective dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. There has been significant progress developing selective dry etch processes using remote plasma excitation of the etchants to selectively remove one dielectric material relative to another. More recently, selective dry etch techniques are being developed to selective remove metals and metal oxides using dry-etch processes. The present application describes advances in the use of selective dry etch techniques to selectively etch particular metals and metal oxides from a substrate surface relative to one or more other materials.

SUMMARY

Methods are described herein for etching metals like cobalt and nickel, which have been historically difficult to etch with dry-etch processes. Cobalt in particular has proven difficult to etch because many halogenated and/or organometallic cobalt compounds are relatively non-volatile at conventional etch processing temperatures. Thus, reacting metallic cobalt with many conventional etch gases such as fluorine ($F_2$) and nitrogen trifluoride ($NF_3$) does not produce etch products that can be easily vaporized and removed from the substrate surface in a dry etch process.

Cobalt is also formed on semiconductor substrates as a polycrystalline metal with many amorphous grain boundaries separating islands of crystal grains. The amorphous and crystalline regions normally do not etch at the same rate, and this can exacerbate the surface roughness on the etched surface. Surface roughness can also be caused by the inhomogeneous distribution of contaminants across the surface of the cobalt. These contaminants can include oxidized regions on the surface as well as non-volatilized cobalt etch products that do not get removed following exposure to the etchant compounds.

The present methods were developed to address the problems of increased surface roughness that resulted from using dry etch processes to etch metallic cobalt. While the present methods were developed for cobalt, they can also be used for other metal layers, such as nickel, platinum, and some other metals, which can etch at uneven rates using conventional dry etch processes.

The present methods include pre-treating an etchable surface of the cobalt layer with a plasma that is formed from a hydrogen-containing gas that reduces cobalt oxide formed on the etchable surface to cobalt metal. The chemical reduction of the cobalt oxide to cobalt metal is complemented by a physical bombardment of the etchable surface by ionically charged species in the plasma. The bombarding species create disorder in exposed areas of crystalline cobalt and convert them into a more amorphous-phased structure similar to the grain boundaries. A more uniform and faster etching cobalt surface is formed as a result of both the chemical and physical pre-treatment of the surface.

Following the pre-treatment of the etchable cobalt surface, a two-stage etching sequence is commenced to etch the cobalt layer. The first etching stage involves exposing the cobalt layer to a halogen-containing precursor that is delivered to a substrate processing region in contact with the substrate containing the cobalt layer. The halogen-containing precursor reacts with the cobalt metal to form a cobalt halide intermediate on the cobalt layer. Residual halogen-containing precursor and volatile etch products are removed from the substrate processing region before the second etching stage, which involves exposing the cobalt layer to a carbon-and-nitrogen-containing precursor. The carbon-and-nitrogen-containing precursor further reacts with the cobalt and cobalt halide etch products to create volatile organometallic cobalt complexes that desorb from the cobalt layer to leave behind an etched cobalt layer.

The two-stage etching sequence may be conducted once, but it will often be conducted multiple times to etch a target amount (e.g., a target etch depth) from the surface of the cobalt layer. When the two-stage etching sequence is conducted multiple times to etch down a cobalt layer, a new sequence begins once the etchant gases and volatile etch products from the previous sequence have been removed. It has been discovered that performing an additional pre-treatment with the plasma formed from the hydrogen-containing gas after a plurality of two-stage etching sequences further reduces the surface roughness and increases the etch rate of the cobalt layer. Thus, the present methods include performing an additional pre-treatment of the partially etched cobalt layer after a number of two-stage etching sequences. Exemplary methods interject a pre-treatment after every five, six, seven, eight, nine, ten, etc., two-stage etching sequences.

Embodiments of the present methods may include etching a metal layer on a semiconductor substrate. The method may include contacting the semiconductor substrate with a pre-treatment plasma formed from a hydrogen containing precursor. The pre-treatment plasma treats the metal layer on the semiconductor substrate to form a pre-treated metal layer. The treatment of the metal layer with the pre-treatment plasma includes (i) reducing metal oxide formed on the metal layer to additional metal, and (ii) bombarding the metal layer to disorder crystalline regions on the metal layer. The pre-treated metal layer is then reacted with a halogen-containing precursor to form a halogenated metal layer that includes a halogenated etch product. The halogen-containing precursor may be removed from the semiconductor substrate before the halogenated etch product on the halogenated metal layer is reacted with a carbon-and-nitrogen-containing precursor to form one or more volatile etch products. The carbon-and-nitrogen-containing precursor and the volatile etch products are removed from the semiconductor substrate to leave behind the etched metal layer on the semiconductor substrate.

Embodiments of the present methods may further include etching a metal layer on a semiconductor substrate by introducing a treatment with a hydrogen-containing precursor after a plurality of etching sequences. The methods include performing a first treatment on the metal layer by exposing the semiconductor substrate to a treatment plasma formed from a hydrogen-containing precursor. The first treatment is followed by a first etching of the metal layer a plurality of times using an etching sequence that includes (i) reacting the metal layer with a halogen-containing precursor, wherein the halogen-containing precursor reacts with the metal layer to form a halogenated metal layer having a halogenated etch product, (ii) reacting the halogenated etch product on the halogenated metal layer with a carbon-and-nitrogen-containing precursor to form one or more volatile etch products, and (iii) removing at least a portion of the volatile etch products before restarting the etching sequence. Following the first etching of the metal layer, a second treatment is performed on the metal layer by exposing the semiconductor substrate to the treatment plasma for a second time. The metal layer is then etched at least one more time with the etching sequence after the second plasma treatment.

It should be appreciated that while the embodiment above describes one plasma treatment before the start of the first etching of the metal layer and a second plasma treatment after the first treatment, additional embodiments of the present methods include further plasma treatments between further etchings of the metal layer. For example, a third plasma treatment may follow the second etching of the metal layer with the above-described etching sequence, and a third etching of the metal layer may follow the third plasma treatment. This pattern may repeat for a plurality of treatment/etch cycles (e.g., three total treatment/etch cycles, four total treatment/etch cycles, five total treatment/etch cycles, six total treatment/etch cycles, etc.) until the metal layer is etched to a target depth.

Additional embodiments and features are set forth in part in the description that follows, and in part will become apparent to those skilled in the art upon examination of the specification or may be learned by the practice of the embodiments. The features and advantages of the embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods are described for etching metal layers that leave behind an etched metal layer with reduced surface roughness. The methods are useful for etching metal layers that are difficult to etch using dry etch processes because they do not easily form volatile etch products. For example, the methods are useful for etching cobalt and/or nickel metal layers and leaving a smooth etched metal surface on a semiconductor substrate. For example, the present methods may be used to etch metal layers that consist of (or consist essentially of) cobalt, metal layers that consist of (or consist essentially of) nickel, and metal layers that consist of (or consist essentially of) platinum. They may also be used to etch metal layers that include, consist of (or consist essentially of) alloys two or more metals chosen from cobalt, nickel, and platinum, as well as other metals.

The present methods include a treatment (sometimes referred to as a pre-treatment) of the metal layer with a plasma that is formed at least in part from a reducing gas such as hydrogen ($H_2$). The treatment is followed by an etching sequence that exposes the treated metal layer first to a halogen-containing precursor and then to a carbon-and-nitrogen-containing precursor. The use of two etch precursors is necessitated because the halogenated metal reaction products formed by contact with the halogen-containing precursor are typically not volatile enough by themselves for a practical dry etch removal process. The precursors are added sequentially instead of simultaneously to keep them from reacting with each other before reacting with the metal layer.

Treating the metal layer with a plasma formed from a reducing precursor (e.g., a hydrogen-containing precursor) before the introduction of the etchant precursors contributes to an etched metal layer with reduced surface roughness. Additional contributing factors include the temperature and amount of time the etchant precursors are in contact with the metal layer on the semiconductor substrate. For example, contacting the treated metal layer with the halogen-containing precursor at a reduced temperature (e.g., 150° C. to 200° C.) for a shorter time period than the halogenated metal layer is in contact with the carbon-and-nitrogen-containing precursor (e.g., 5 seconds to 30 seconds) has been shown to further reduce surface roughness.

Figure 1:
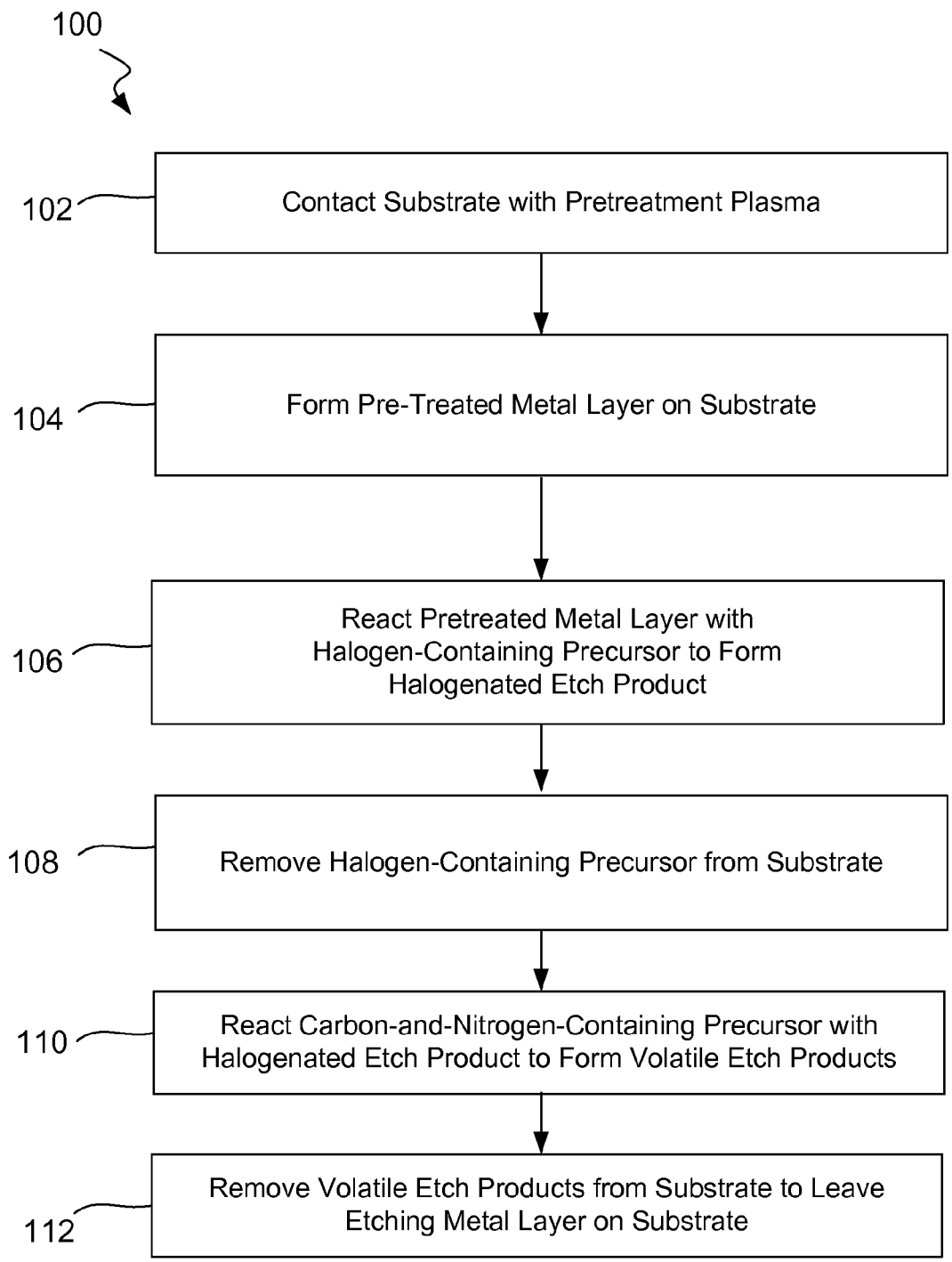
FIG. 1 is a flow chart of a metal layer etch process according to embodiments.

Referring now to FIG. 1, a flowchart highlighting some of the events in a method 100 of etching a metal layer on a semiconductor substrate is shown. The method 100 includes contacting the semiconductor substrate with a pre-treatment plasma 102. The pre-treatment plasma is formed from a hydrogen-containing precursor, such as hydrogen gas ($H_2$). The hydrogen-containing precursor may include additional gases such as helium gas, argon gas, nitrogen gas ($N_2$), and combinations of these gases. For example, the hydrogen-containing precursor may be a mixture of hydrogen and helium gases. The hydrogen-containing precursor may be oxygen-free and/or carbon-free. For example, the precursor may lack water vapor and/or a hydrocarbon gas such as methane.

The pre-treatment plasma is formed by striking a plasma from the hydrogen-containing precursor. The plasma is a local plasma in direct contact with exposed surfaces of the metal layer and other features on the semiconductor substrate. This local plasma may be struck using a variety of plasma generation techniques such as radio frequency excitations, capacitively-coupled power and inductively coupled power. For example, the plasma can be generated with a capacitively coupled plasma (CCP) generation technique to form the plasma in a substrate processing region that also hold the semiconductor substrate. Exemplary RF power levels used to generate the plasma may range from 25-1500 Watts (e.g., 100 W-1200 W, 150 W-750 W, 200 W-300 W, etc.). The hydrogen-containing precursor may be supplied to the substrate processing region at flow rates ranging from 50 sccm to 2000 sccm (e.g., 100 sccm to 1000 sccm), where a sccm is a standard cubic centimeters per minute. Exemplary plasma pressures may range from 0.01 Torr to 10 Torr and all pressures in between (e.g., 1 Torr). The pre-treatment plasma in contact with the metal layer generally as a temperature of 30° C. to 300° C. (e.g., 30° C. to 200° C.). Specific exemplary temperatures include 30° C., 60° C., 90° C., etc. The pre-treatment of the metal layer generally takes from 5 seconds to 5 minutes (e.g., from 1 to 2 minutes).

The metal layer is treated with the pre-treatment plasma to form a pre-treated metal layer 104. Pre-treatment of the metal layer with the hydrogen-containing precursor has both a chemical and physical effect on the metal layer. The chemical effect includes reducing metal oxide that has formed on the surface of the metal layer to the unoxidized metal. For example, when the metal layer includes cobalt, the plasma excited hydrogen radicals and molecules (e.g., H* and $H_2$*) reduce cobalt oxide (e.g., $CoO_x$) on the metal layer back to cobalt metal (Co). The physical effect includes bombarding the metal layer to disorder crystalline regions in the metal layer to make them more amorphous. For a polycrystalline cobalt layer, the bombardment converts the orderly crystal grains in the layer to a more amorphous cobalt like that found in the boundary layers between crystal grains.

The treatment of the metal layer with the pre-treatment plasma 104 can have several beneficial effects for the subsequent etching sequence. First, the reduction of metal oxide to metal permits the metal layer to etch more rapidly. Metal oxides are significantly slower and more difficult to etch than the metal with the present etchant precursors, so removing a significant portion or all of the metal oxide from the etch surface of the metal layer permits the layer both to etch faster and more evenly. Second, the physical bombardment of crystalline metal regions on the metal layer creates a more homogeneous and reactive etch surface for the etchant precursors. Because the crystalline regions found in the crystal grains of the metal layer usually etch more slowly than the amorphous regions found in the interstitial grain boundaries, the metal layer etches unevenly, which increases the surface roughness of the etched metal layer. By disordering the crystalline regions of the metal layer with physical bombardment from accelerated ions in the plasma, the etch surface of the metal layer is made more uniformly amorphous.

Following the treatment of the metal layer with the pre-treatment plasma, the pre-treated metal layer may be reacted with a halogen-containing precursor to form a halogenated metal layer 106. The halogen-containing precursor may be a halogen gas such as chlorine gas ($Cl_2$) and/or a chlorine-containing precursor such as xenon dichloride ($XeCl_2$) or boron trichloride ($BCl_3$). The halogen-containing precursor may also include inert gases such as helium, argon, or a combination of both. When the halogen-containing precursor reacts with the metal in the treated metal layer, it forms a halogenated etch product such as a metal halide (e.g., a metal chloride). For example, when the metal layer includes cobalt and the halogen-containing gas includes chloride gas, the halogenated etch products include cobalt chloride.

The reaction of the pre-treated metal layer with the halogen-containing precursor may be done at lower temperature and for shorter times than typical for conventional metal etch processes using halogen-containing precursors. For example, the halogen-containing precursor may contact the metal layer on the substrate at a temperature of 150° C.-200° C. for a time period of 5 to 30 seconds. A specific example is reacting an pre-treated cobalt metal layer with chlorine gas at a reaction temperature of 150° C. for 5 seconds. The halogen-containing precursor may be supplied to the semiconductor substrate at a flow rate of between 3 sccm to 50 sccm (standard cubic centimeters per minute), for example 5-20 sccms.

Following the reaction of the halogen-containing precursor with the pre-treated metal layer, the precursor may be removed from contact with the semiconductor substrate 108. Removal may be accomplished by evacuating the precursor from a substrate processing region holding the semiconductor substrate, flushing the substrate with an inert gas such as helium and/or argon, or a combination of both evacuation and flushing. For example, the halogen-containing precursor may be removed from the semiconductor substrate holding the halogenated-metal layer by evacuating and flushing the substrate processing region holding the substrate with a mixture of helium and argon gas for a period of 30 seconds to 75 seconds. The removal of the halogen-containing precursor before the introduction of a second etchant precursor prevents the two etchant precursors from reacting with each other before reacting with the metal layer.

Because halogenated etch products like cobalt chloride are not volatile enough to be removed at thermal reaction temperatures of 150° C.-200° C., the halogenated metal layer is reacted with a second etchant gas comprising a carbon-and-nitrogen-containing precursor 110. The carbon-and-nitrogen-containing precursor reacts with the halogenated etch product to form a volatile metal-organic compound that can be removed in the gas phase from the semiconductor substrate. Exemplary carbon-and-nitrogen-containing precursors include compounds having at least one carbon-nitrogen bond such as amines having a hydrocarbon component and one or more nitrogen groups. The amines may be primary amines that have the amine nitrogen bonded to one carbon moiety, secondary amines that have the amine nitrogen bonded to two carbon moieties, and tertiary amines that have the amine nitrogen bonded to three carbon moieties. They may include amines having the formula $R_2$—N—$[CH_2]_m$—N—$R_2$, where m is 1, 2 or 3 and R is H—, —$CH_3$, —$C_2H_5$, or a larger alkyl moiety. Exemplary amines may include diamines such as ortho-, meta-, and para-phenylenediamine, as well as tetramethylethylenediamine (TMEDA) having the formula $(CH_3)_2NCH_2CH_2N(CH_3)_2$. When a carbon-and-nitrogen-containing precursor such as TMEDA reacts with a halogenated etch product such as cobalt chloride, they form volatile etch products like cobalt-methyl monomers that can be removed in the gas phase from the metal layer at the reaction temperatures. The carbon-and-nitrogen-containing precursor may include additional compounds such as a carrier gas (e.g., helium gas).

The carbon-and-nitrogen-containing precursor may be supplied to the halogenated metal layer on the semiconductor substrate at a flow rate of between 10 sccm and 300 sccm (e.g., 20 sccm to 200 sccm). The carbon-and-nitrogen-containing precursor may be a liquid precursor prior to contact with the semiconductor substrate, in which case a bubbler and carrier gas may be used to deliver a gaseous carbon-and-nitrogen-containing precursor to the substrate. The bubbler may heat the carbon-and-nitrogen-containing precursor above room temperature, for example to between 25° C. and 60° C., to increase the vapor pressure while the carrier gas is flowed through the liquid. The carrier gas may be relatively inert in comparison to the carbon-and-nitrogen-containing precursor. Helium may be used as the carrier gas. The carrier gas may be flowed from 1 slm to 5 slm (standard liters per minute). Alternate carrier gases and flow rates may be used depending on a number of factors including process chamber configuration, substrate size, geometry and layout of features being etched.

Exemplary reaction temperatures for the reaction of the carbon-and-nitrogen-containing precursor with the halogenated etch product may be 150° C.-200° C. In many instances, the reaction temperature may be the same as the reaction temperature for the halogen-containing precursor with the pre-treated metal layer, particularly if both reactions occur sequentially in the same substrate processing region of an etch chamber. The carbon-and-nitrogen-containing precursor may be in contact with the halogenated metal layer for the same period of time or longer than the halogen-containing precursor was in contact with the pre-treated metal layer. Contact times for the carbon-and-nitrogen-containing precursor generally range from 15 seconds to 45 seconds, with 15 second and 25 second contact times being typical.

The volatile metal-organic compounds formed by the reaction of the carbon-and-nitrogen containing precursor and the halogenated etch product are removed in the gas phase to leave behind an etched metal layer on the semiconductor substrate 112. The volatile metal-organic compounds may be removed by evacuating and/or flushing a substrate processing region holding the semiconductor substrate. Flushing may be accomplished by introducing an inert gas (e.g., helium, argon, etc.) or gas mixture into the substrate processing region. The inert gas or gas mixture may be introduced to the substrate processing region at low pressure (e.g., down to 0.01 Torr). For example, when the metal layer contains cobalt, the volatile methyl-cobalt compounds (e.g., $Co(CH_3)_4$) may be evacuated and flushed from the substrate processing region with a mixture of helium and argon gas. The removal of the volatile metal-organic compounds may result in the removal of roughly 2 Å to 8 Å (e.g., 3 Å to 6 Å) of metal from the etched metal layer.

The reactions of the metal layer with either or both of the first and second etchant precursors may be conducted in the absence of a local plasma and/or a remote plasma. In other words, the reactions of the metal layer with either or both the first or second etchant precursors may be described as plasma free. More specifically, the reaction of the halogen-containing precursor with the pre-treated metal layer may be done in the absence of a plasma. Likewise, the reaction of the carbon-and-nitrogen-containing precursor may be done in the absence of a plasma. Either or both reactions may rely on the thermal excitation of the etchant precursors at the reaction temperature without any prior excitation in a remote plasma that is physically removed from the semiconductor substrate, or excitation in a local plasma that makes direct contact with the substrate. The pressure of the etchant precursors while reacting with the metal layer are typically below 20 Torr, and may be below 15 Torr, 5 Torr or 3 Torr. For example, the pressure of the etchant precursors may independently range from 10 mTorr to 10 Torr.

All the phases of method 100 may be performed in a single chamber, or the phases may be divided between more than one chamber. For example, the plasma pretreatment of the metal layer may be performed in a first chamber capable of forming a local plasma, and the reaction of the metal layer with the first and second etchant precursors may be performed in a second chamber that does not have to be equipped to generate a plasma. In further examples, separate chambers may be used for (i) the plasma pretreatment, (ii) the reaction with the halogen-containing precursor, and (iii) the reaction with the carbon-and-nitrogen-containing precursor.

Method 100 shows a single pre-treatment of the metal layer followed by a single etching sequence of the pre-treated metal layer with (i) reaction of the metal layer with a halogen-containing precursor followed by (ii) reaction of the halogenated metal layer with a carbon-and-nitrogen-containing precursor. It should be appreciated that the sequence described in method 100 may be repeated more than one time, which each successive cycle etching an additional amount of metal from the metal layer (e.g., removal of 1 Å to 10 Å of metal per etch cycle).

Figure 2:
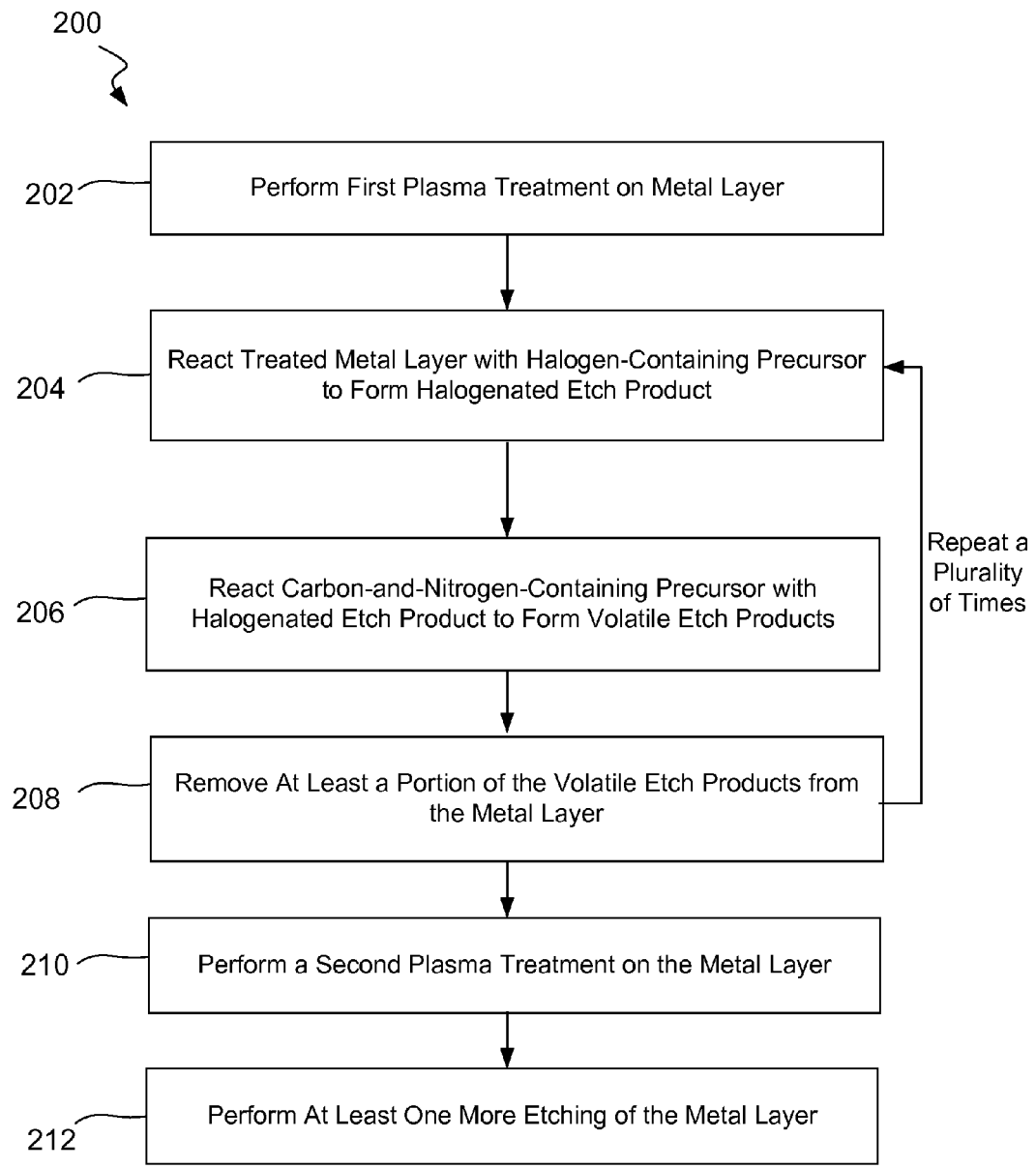
FIG. 2 is a flow chart of a metal layer etch process according to embodiments.

In many instances, it is inefficient to perform a plasma treatment after every cycle of reacting and removing a portion of the metal from the metal layer. FIG. 2 shows an method 200 that includes a plasma treatment after the metal has been etched from the metal layer for a plurality of etch cycles. The method 200 includes performing a first treatment on the metal layer by exposing the semiconductor substrate to a treatment plasma formed from a hydrogen-containing precursor 202. The local plasma used in the first treatment may formed from the same precursor gases under the same plasma formation conditions described above for the pre-treatment of the metal layer 104.

Following the first plasma treatment 202, the metal layer may be first etched a plurality of times using the following etching sequence: First, the metal layer is reacted with a halogen-containing precursor 204 to form a halogenated metal layer having a halogenated etch product. Then the halogenated etch product on the halogenated metal layer may be reacted with a carbon-and-nitrogen-containing precursor 206 to form one or more volatile etch products. Each etching sequence concludes by removing at least a portion of the volatile etch products 208 before restarting the etching sequence with another reaction of the metal layer and halogen-containing precursor.

The first and second reactions in the etching sequence may be terminated by removing the reacting precursor from the semiconductor substrate. More specifically, the reaction of the metal layer with the halogen-containing precursor may be terminated by evacuating the halogen-containing precursor from a substrate processing region holding the semiconductor substrate and/or flushing the substrate processing region with an inert gas or mixture of inert gases (e.g., helium, argon, etc.). Similarly, the reaction of the halogenated etch products with the carbon-and-nitrogen-containing precursor can be terminated by evacuating and/or flushing the precursor from the substrate processing region. The same evacuation and/or flushing may be used to remove volatile etch products before restarting the etching sequence 208.

The plurality of times that the etching sequence is performed before introducing another plasma treatment may depend on the etch rate and surface roughness requirements for the etched metal layer, among other factors. The plurality of times may be 2 times, 5 times, 10 times, 20 times, 30 time, 40 time, 50 times, 60 times, 70 times, 80 times, 90, times, or 100 times, as well as numbers in between the listed times, among other numbers of times. For example the plurality of times for performing an etching sequence that includes reacting a cobalt layer with chlorine gas, reacting the cobalt chloride etch products on the halogenated metal layer with TMEDA to form cobalt-methyl volatile etch products, and removing those etch products may range from 20 times to 80 times (e.g., 30 times).

Following the performance of the etching sequence for the plurality of times, a second plasma treatment may be performed on the metal layer 210 following the first etching series. The second plasma treatment may be done with a local plasma generated from the same type hydrogen-containing precursor under the same plasma generation conditions as the first treatment. Similar to the first treatment, the second plasma treatment increases the etching rate and reduces the surface roughness of the metal layer through both chemical and physical conditioning of the metal layer. The chemical conditioning may include the reaction of excited hydrogen species with oxidized and/or halogenated metal compounds on the exposed surface to reduce these compounds back to the metal. The physical conditioning includes the bombardment of crystallized regions on the metal layer to make them more amorphous and more similar to the interstitial grain boundaries between crystal grains in the metal layer.

The second treatment of the partially etched metal layer may be followed by at least one more etching of the metal layer with the above-described etching sequence 212. In embodiments not shown in method 200, the at least one more etching of the metal layer may include a second etch of the metal layer for a plurality of times using the etching sequence. The plurality of times may be the same or a different number of times as the first etch. It should also be appreciated that this second etch may be followed by another plasma treatment. Further cycles of plasma treatments and etchings of the metal layer may continue until a target amount of metal is removed from the metal layer (e.g., removing 100 Å to 1000 Å of metal from the metal layer).

The terms "treatment" and "pre-treatment" as used in the context of the local plasma pre-treatment (or treatment) with the plasma formed from a hydrogen-containing precursor, may be used interchangeably in the present application. "Pre-treatment" is more likely to be used to describe the local plasma treatment of the metal layer before it has been exposed to any etchant precursors, while "treatment" is more commonly used to describe the local plasma treatment after one more etching sequences have been performed on the metal layer.

Additional process parameters are disclosed in the course of describing an exemplary processing chamber and system.

Exemplary Processing System

Figure 3A:
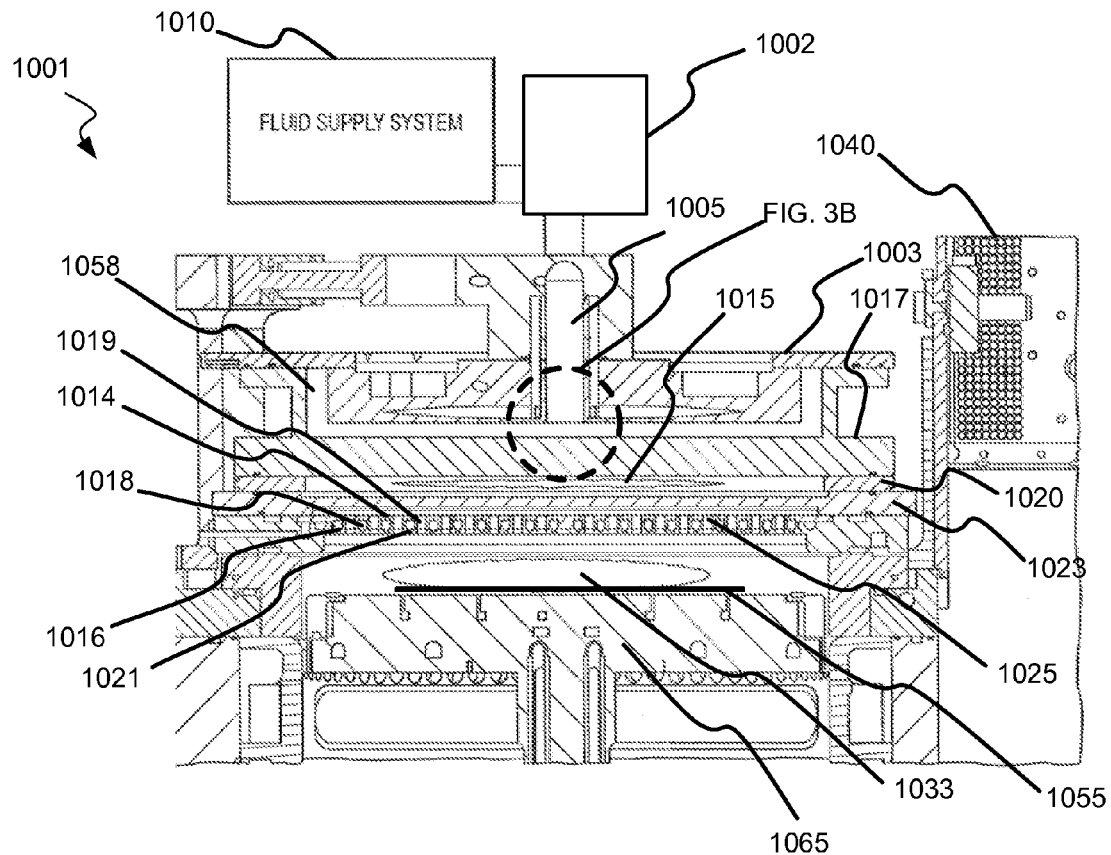
FIG. 3A shows a schematic cross-sectional view of a substrate processing chamber according to the disclosed technology.

FIG. 3A shows a cross-sectional view of an exemplary substrate processing chamber 1001 with partitioned plasma generation regions within the processing chamber. During film etching, a process gas may be flowed into chamber plasma region 1015 through a gas inlet assembly 1105. A remote plasma system (RPS) 1002 may optionally be included in the system, and may process a first gas which then travels through gas inlet assembly 1105. The inlet assembly 1105 may include two or more distinct gas supply channels where the second channel (not shown) may bypass the RPS 1002, if included. Accordingly, in embodiments the precursor gases may be delivered to the processing chamber in an unexcited state. In another example, the first channel provided through the RPS may be used for the process gas and the second channel bypassing the RPS may be used for a treatment gas in embodiments. The process gas may be excited within the RPS 1002 prior to entering the chamber plasma region 1015. Accordingly, the chlorine-containing precursor as discussed above, for example, may pass through RPS 1002 or bypass the RPS unit in embodiments. Various other examples encompassed by this arrangement will be similarly understood.

A cooling plate 1003, faceplate 1017, ion suppressor 1023, showerhead 1025, and a substrate support 1065 (also known as a pedestal), having a substrate 1055 disposed thereon, are shown and may each be included according to embodiments. The pedestal 1065 may have a heat exchange channel through which a heat exchange fluid flows to control the temperature of the substrate. This configuration may allow the substrate 1055 temperature to be cooled or heated to maintain relatively low temperatures, such as between about −20° C. to about 200° C. or there between (e.g., 60° C., 90° C., 150° C., etc.). The heat exchange fluid may comprise ethylene glycol and/or water. The wafer support platter of the pedestal 1065, which may comprise aluminum, ceramic, or a combination thereof, may also be resistively heated to achieve relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 1065, which may be further configured to rotate.

The faceplate 1017 may be pyramidal, conical, or of another similar structure with a narrow top portion expanding to a wide bottom portion. The faceplate 1017 may additionally be flat as shown and include a plurality of through-channels used to distribute process gases. Plasma generating gases and/or plasma excited species, depending on use of the RPS 1002, may pass through a plurality of holes, shown in FIG. 3B, in faceplate 1017 for a more uniform delivery into the chamber plasma region 1015.

Exemplary configurations may include having the gas inlet assembly 1105 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1105, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region. A baffle (not shown) may additionally be located in the chamber plasma region 1015, or otherwise coupled with gas inlet assembly 1105, to affect the flow of fluid into the region through gas inlet assembly 1105.

The ion suppressor 1023 may comprise a plate or other geometry that defines a plurality of apertures throughout the structure that are configured to suppress the migration of ionically-charged species out of chamber plasma region 1015 while allowing uncharged neutral or radical species to pass through the ion suppressor 1023 into an activated gas delivery region between the suppressor and the showerhead. In embodiments, the ion suppressor 1023 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor.

The ion suppression element 1023 may function to reduce or eliminate the amount of ionically charged species traveling from the plasma generation region to the substrate. Showerhead 1025 in combination with ion suppressor 1023 may allow a plasma present in chamber plasma region 1015 to avoid directly exciting gases in substrate processing region 1033, while still allowing excited species to travel from chamber plasma region 1015 into substrate processing region 1033. In this way, the chamber may be configured to prevent the plasma from contacting a substrate 1055 being etched. This may advantageously protect a variety of intricate structures and films patterned on the substrate, which may be damaged, dislocated, or otherwise warped if directly contacted by a generated plasma. Additionally, when plasma is allowed to contact the substrate (i.e., a local plasma), the rate at which target materials etch may increase.

The processing system may further include a power supply 1040 electrically coupled with the processing chamber to provide electric power to the faceplate 1017, ion suppressor 1023, showerhead 1025, and/or pedestal 1065 to generate a plasma in the chamber plasma region 1015 or processing region 1033. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to chamber plasma region 1015. This in turn may allow development of particular plasma characteristics such that precursors may be dissociated in specific ways to enhance the etching profiles produced by these precursors.

A plasma may be ignited in chamber plasma region 1015 above showerhead 1025 (i.e., a remote plasma) and/or substrate processing region 1033 below showerhead 1025 (i.e., a local plasma). A local plasma formed from the hydrogen-containing precursor in the substrate processing region 1033 is used in the pretreatment and/or treatment of a metal layer on a semiconductor substrate 1055 according to the present methods. Etching of the metal layer following the plasma pretreatment and/or treatment may be performed in the same substrate processing region, which may be plasma-free during each reaction of the etchant precursor with a metal layer (for example during a reaction of a halogen-containing precursor with the metal layer and a subsequent reaction of a carbon-and-nitrogen-containing precursor with the metal layer). An AC voltage typically in the radio frequency (RF) range may be applied between the conductive top portion of the processing chamber, such as faceplate 1017, and showerhead 1025 and/or ion suppressor 1023 to ignite a plasma in chamber plasma region 1015 during local plasma pretreatment and/or treatment processes. An RF power supply may generate a high RF frequency of 13.56 MHz but may also generate other frequencies alone or in combination with the 13.56 MHz frequency.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF frequency applied in the exemplary processing system may be low RF frequencies less than about 200 kHz, high RF frequencies between about 10 MHz and about 15 MHz, or microwave frequencies greater than or about 1 GHz in different embodiments. The plasma power may be capacitively-coupled (CCP) or inductively-coupled (ICP).

Plasma power may also be simultaneously applied to both chamber plasma region 1015 and substrate processing region 1033. The frequencies and powers above apply to both regions. Either region may be excited using either a capacitively-coupled plasma (CCP) or an inductively-coupled plasma (ICP).

Chamber plasma region 1015 (top plasma in figure) may be left at low or no power when a bottom plasma in the substrate processing region 1033 is turned on to, for example, cure a film or clean the interior surfaces bordering substrate processing region 1033. A plasma in substrate processing region 1033 may be ignited by applying an AC voltage between showerhead 1055 and the pedestal 1065 or bottom of the chamber. A cleaning gas may be introduced into substrate processing region 1033 while the plasma is present.

A fluid or gas precursor, for example a carbon-and-nitrogen-containing precursor or a halogen-containing precursor, may flow into the substrate processing region 1033 through a showerhead 1025. While these precursors are generally not plasma excited in the present methods, excited species derived from the process gas in chamber plasma region 1015 can travel through apertures in the ion suppressor 1023, and/or showerhead 1025 and react with an additional precursor flowing into the processing region 1033 from a separate portion of the showerhead. Alternatively, if all precursor species are being excited in chamber plasma region 1015, no additional precursors may be flowed through the separate portion of the showerhead. Little or no plasma may be present in the substrate processing region 1033. Excited derivatives of the precursors may combine in the region above the substrate and, on occasion, on the substrate to etch structures or remove species on the substrate in disclosed applications.

When excited precursors are used, exciting the precursors in the chamber plasma region 1015 directly, or exciting the fluids in the RPS units 1002, may provide several benefits. The concentration of the excited species derived from the fluids may be increased within the processing region 1033 due to the plasma in the chamber plasma region 1015. This increase may result from the location of the plasma in the chamber plasma region 1015. The processing region 1033 may be located closer to the chamber plasma region 1015 than the remote plasma system (RPS) 1002, leaving less time for the excited species to leave excited states through collisions with other gas molecules, walls of the chamber, and surfaces of the showerhead.

The uniformity of the concentration of the excited species derived from the precursor may also be increased within the processing region 1033. This may result from the shape of the chamber plasma region 1015, which may be more similar to the shape of the processing region 1033. Excited species created in the RPS 1002 may travel greater distances to pass through apertures near the edges of the showerhead 1025 relative to species that pass through apertures near the center of the showerhead 1025. The greater distance may result in a reduced excitation of the excited species and, for example, may result in a slower growth rate near the edge of a substrate. Exciting the fluids in the chamber plasma region 1015 may mitigate this variation for the fluid flowed through RPS 1002, or alternatively bypassed around the RPS unit.

The precursors may be excited in chamber plasma region 1015 and may be passed through the showerhead 1025 to the processing region 1033 in the excited state. While a plasma may be generated in the processing region 1033, a plasma may alternatively not be generated in the processing region. In one example, the only excitation of the precursors may be from exciting them in chamber plasma region 1015 to react with one another in the processing region 1033. As previously discussed, this may be to protect the structures patterned on the substrate 1055.

In addition to the precursors, there may be other gases introduced at varied times for varied purposes, including carrier gases to aid delivery. A treatment gas may be introduced to remove unwanted species from the chamber walls and/or the substrate. A treatment gas may be excited in a plasma and then used to reduce or remove residual content inside the chamber. In other embodiments the treatment gas may be used without a plasma. When the treatment gas includes water vapor, the delivery may be achieved using a mass flow meter (MFM), an injection valve, or by commercially available water vapor generators. The treatment gas may be introduced to the processing region 1033, either through the RPS unit or bypassing the RPS unit, and may further be excited in the first plasma region.

Figure 3B:
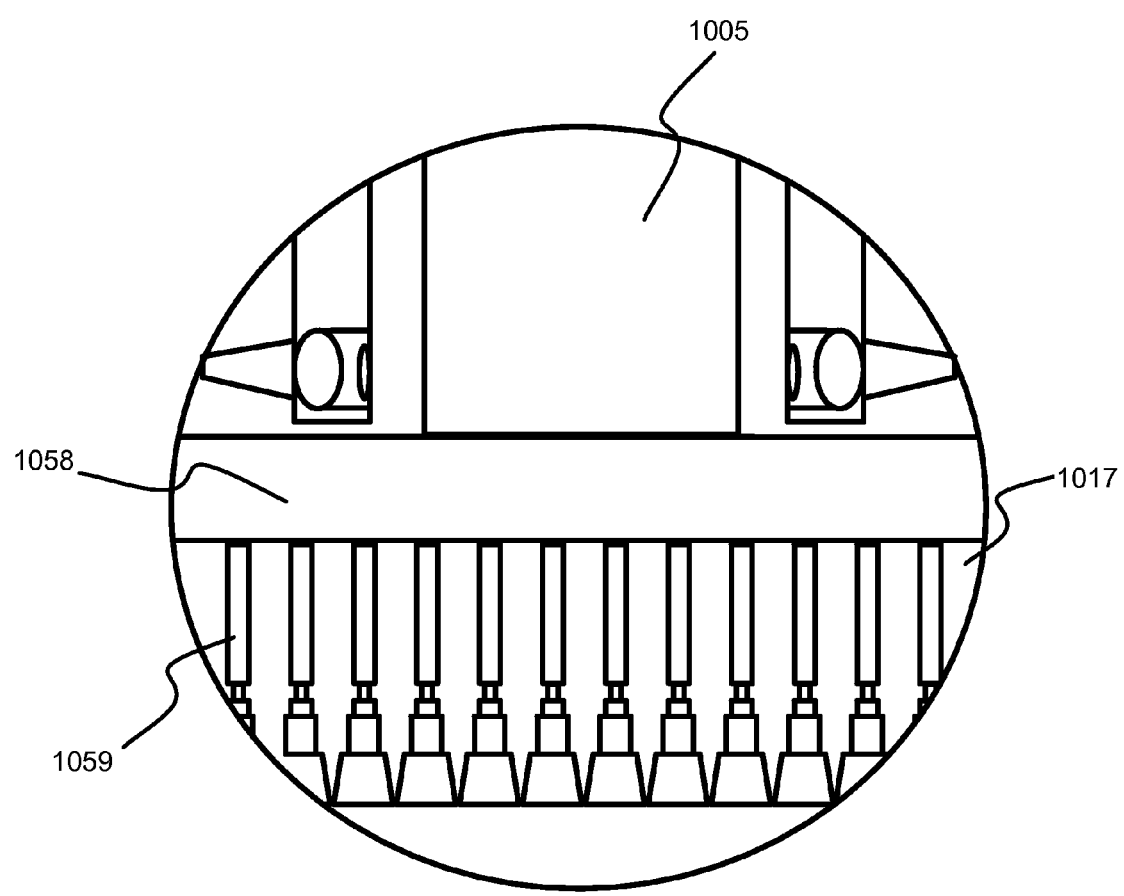
FIG. 3B shows a schematic cross-sectional view of a portion of a substrate processing chamber according to the disclosed technology.

FIG. 3B shows a detailed view of the features affecting the gas distribution through faceplate 1017. As shown in FIG. 3A and FIG. 3B, faceplate 1017, cooling plate 1003, and gas inlet assembly 1105 intersect to define a gas supply region 1058 into which process gases may be delivered from gas inlet 1105. The gases may fill the gas supply region 1058 and flow to chamber plasma region 1015 through apertures 1059 in faceplate 1017. The apertures 1059 may be configured to direct flow in a substantially unidirectional manner such that process gases may flow into processing region 1033, but may be partially or fully prevented from backflow into the gas supply region 1058 after traversing the faceplate 1017.

Figure 3C:
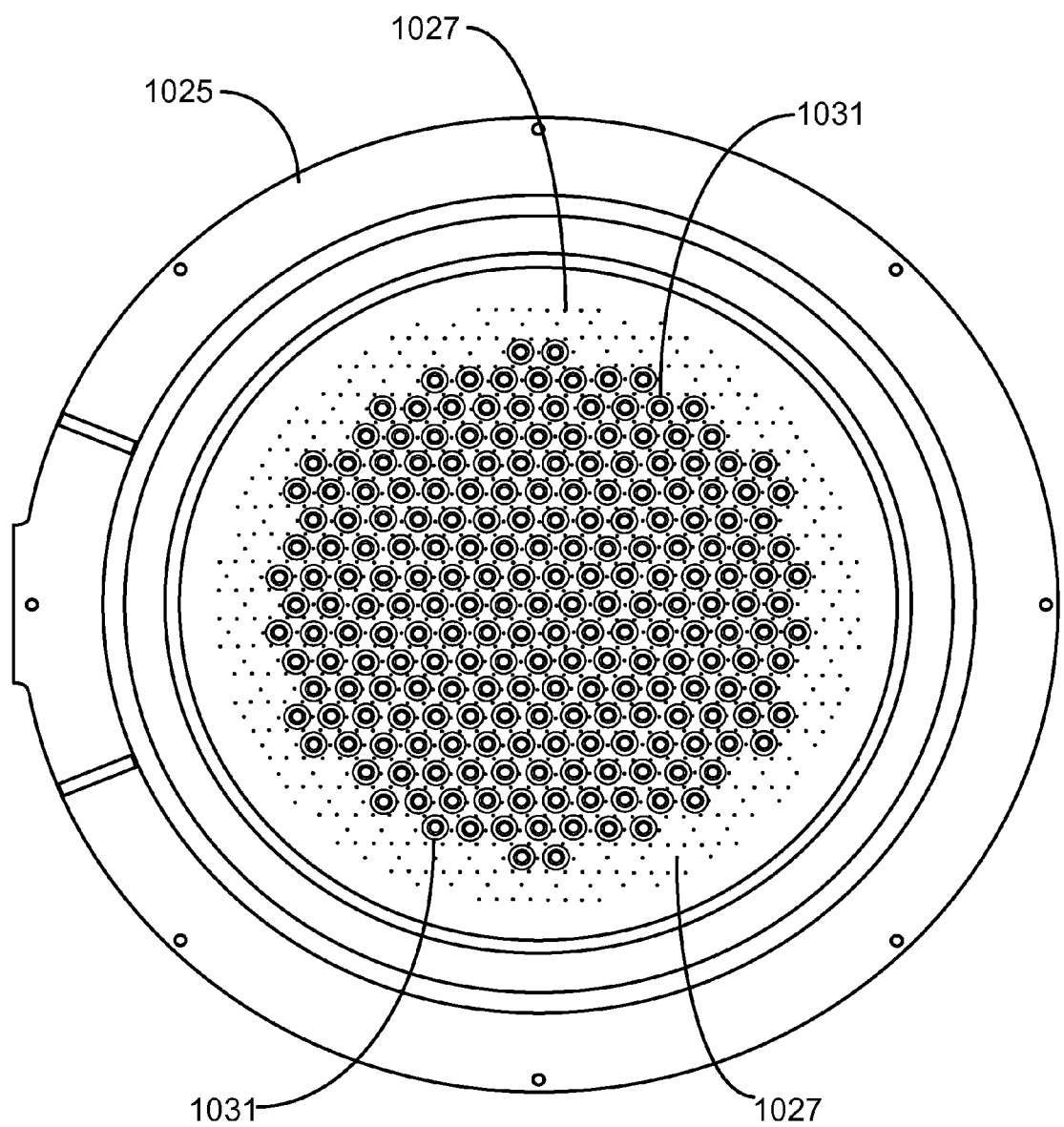
FIG. 3C shows a bottom plan view of a showerhead according to the disclosed technology.

The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary chamber of FIG. 3A includes a dual-channel showerhead, it is understood that alternative distribution assemblies may be utilized that maintain first and second precursors fluidly isolated prior to the processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 precursors which contain plasma effluents upon excitation by a plasma in chamber plasma region 1015. In embodiments, the process gas introduced into the RPS 1002 and/or chamber plasma region 1015 may contain hydrogen. The precursor may also include a carrier gas such as helium, argon, nitrogen ($N_2$), etc. Plasma effluents may include ionized or neutral derivatives of the precursor and may also be referred to herein as a radical-hydrogen precursor referring to the atomic constituent of the precursor introduced.

FIG. 3C is a bottom view of a showerhead 1025 for use with a processing chamber according to embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Substrate processing region 1033 can be maintained at a variety of pressures during the flow of precursors, any carrier gases, and plasma effluents into substrate processing region 1033. The pressure may be maintained between about 1 Torr and about 20 Torr (e.g. about 5 Torr to about 10 Torr).

Figure 4:
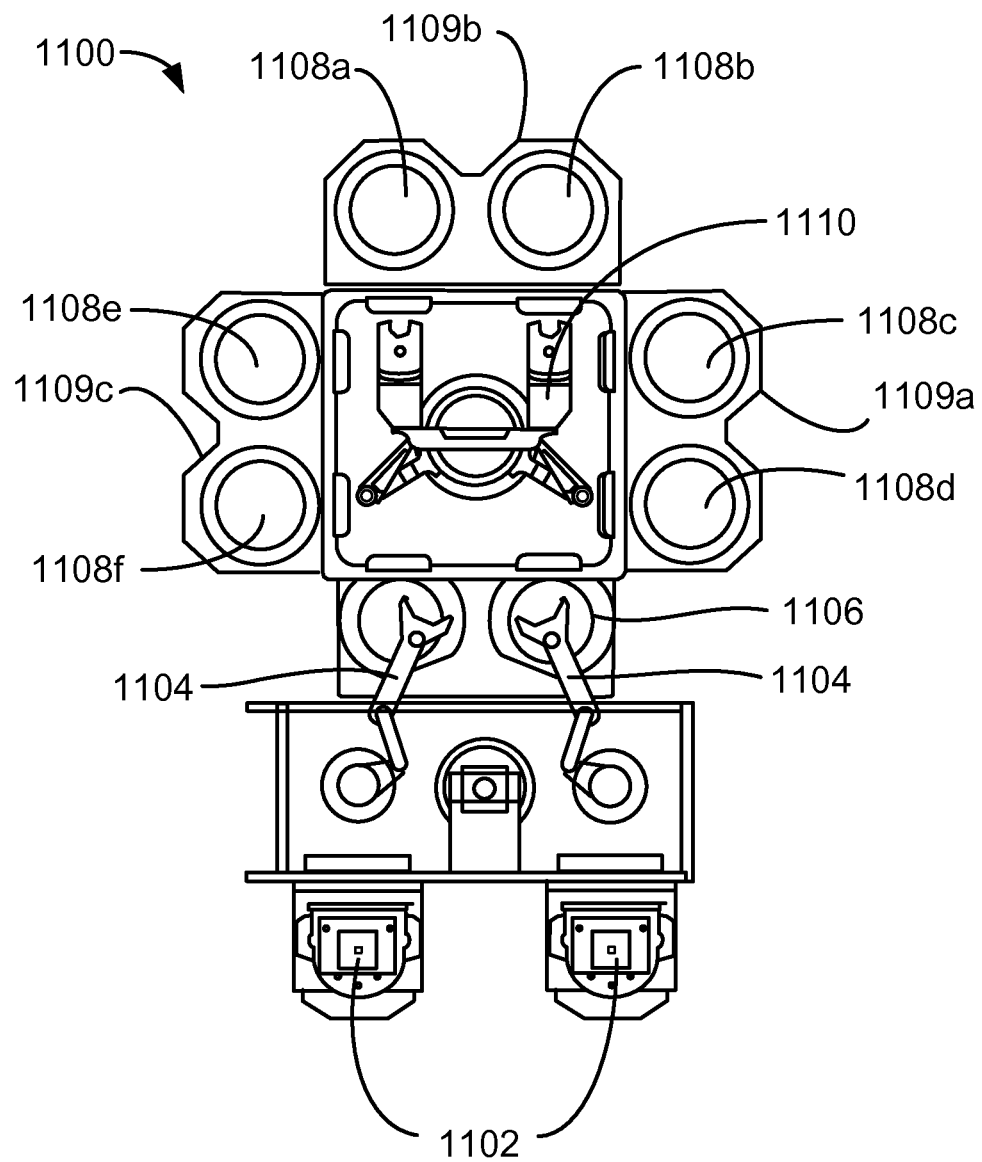
FIG. 4 shows a top plan view of an exemplary substrate processing system according to the disclosed technology.

Embodiments of the processing chambers may be incorporated into larger fabrication systems for producing integrated circuit chips. FIG. 4 shows one such processing system 1101 of deposition, etching, baking, and curing chambers according to embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 1108a-f may include one or more system components for depositing, annealing, curing and/or etching a dielectric film on the substrate wafer. In one configuration, two pairs of the processing chamber, e.g., 1108c-d and 1108e-f, may be used to deposit dielectric material on the substrate, and the third pair of processing chambers, e.g., 1108a-b, may be used to etch the deposited dielectric. In another configuration, all three pairs of chambers, e.g., 1108a-f, may be configured to etch a dielectric film on the substrate. Any one or more of the processes described may be carried out in chamber(s) separated from the fabrication system shown in different embodiments.

In the preceding description, for the purposes of explanation, numerous details have been set forth to provide an understanding of various embodiments of the present invention. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly Si but may include minority concentrations of other elemental constituents such as nitrogen, oxygen, hydrogen or carbon. Exposed "cobalt" of the patterned substrate is predominantly cobalt but may include minority concentrations of other elemental constituents such as oxygen, hydrogen and carbon. Of course, "exposed cobalt" may consist of only cobalt. Exposed "silicon nitride" of the patterned substrate is predominantly $Si_3N_4$ but may include minority concentrations of other elemental constituents such as oxygen, hydrogen and carbon. "Exposed silicon nitride" may consist of silicon and nitrogen. Exposed "silicon oxide" of the patterned substrate is predominantly $SiO_2$ but may include minority concentrations of other elemental constituents such as nitrogen, hydrogen and carbon. In some embodiments, silicon oxide films etched using the methods disclosed herein consist of silicon and oxygen. "Cobalt oxide" is predominantly cobalt and oxygen but may include minority concentrations of other elemental constituents such as nitrogen, hydrogen and carbon. Cobalt oxide may consist of cobalt and oxygen.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-hydrogen" are radical precursors which contain hydrogen but may contain other elemental constituents. The phrase "inert gas" refers to any gas which does not form chemical bonds when etching or being incorporated into a film. Exemplary inert gases include noble gases (e.g., helium, neon, argon, krypton, xenon) but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a metal layer on a semiconductor substrate, the method comprising:
   contacting the semiconductor substrate with a pre-treatment plasma, wherein the pre-treatment plasma is formed from a hydrogen-containing precursor;
   treating the metal layer with the pre-treatment plasma to form a pre-treated metal layer, wherein the treating of the metal layer includes:
      (i) reducing metal oxide formed on the metal layer to additional metal, and
      (ii) bombarding the metal layer to disorder crystalline regions on the metal layer;
   reacting the pre-treated metal layer with a halogen-containing precursor, wherein the halogen-containing precursor reacts with the pre-treated metal layer to form a halogenated metal layer comprising a halogenated etch product;
   removing the halogen-containing precursor from the semiconductor substrate;
   reacting the halogenated etch product on the halogenated metal layer with a carbon-and-nitrogen-containing precursor to form one or more volatile etch products; and
   removing the carbon-and-nitrogen-containing precursor and the volatile etch products from the semiconductor substrate, wherein the removal of the volatile etch products leaves behind the etched metal layer on the semiconductor substrate.

2. The method of claim 1, wherein the halogen-containing precursor reacts with the pre-treated metal layer in the absence of a reactive plasma.

3. The method of claim 1, wherein the carbon-and-nitrogen-containing precursor reacts with the halogenated etch product in the absence of a reactive plasma.

4. The method of claim 1, wherein the metal layer comprises at least one of cobalt and nickel.

5. The method of claim 1, wherein the metal layer comprises cobalt and the metal oxide comprises cobalt oxide.

6. The method of claim 1, wherein the hydrogen-containing precursor comprises $H_2$ gas.

7. The method of claim 1, wherein the halogen-containing precursor comprises a halogen gas.

8. The method of claim 7, wherein the halogen gas comprises $Cl_2$ gas.

9. The method of claim 1, wherein the carbon-and-nitrogen-containing precursor comprises an amine.

10. The method of claim 9, wherein the amine is a diamine.

11. The method of claim 10, wherein the diamine comprises tetramethylethylenediamine.

12. The method of claim 1, wherein the treating of the metal layer with the pre-treatment plasma is performed at 30° C. to 200° C.

13. The method of claim 1, wherein the reacting of the pre-treated metal layer with the halogen-containing precursor is performed at 150° C. to 200° C.

14. The method of claim 1, wherein the semiconductor substrate is exposed to the halogen-containing precursor for a shorter time than the semiconductor substrate is exposed to the carbon-and-nitrogen-containing precursor.

15. A method of etching a metal layer on a semiconductor substrate, the method comprising:
   performing a first treatment on the metal layer by exposing the semiconductor substrate to a treatment plasma formed from a hydrogen-containing precursor;
   first etching the metal layer a plurality of times using an etching sequence comprising:
      (i) reacting the metal layer with a halogen-containing precursor, wherein the halogen-containing precursor reacts with the metal layer to form a halogenated metal layer comprising a halogenated etch product,
      (ii) reacting the halogenated etch product on the halogenated metal layer with a carbon-and-nitrogen-containing precursor to form one or more volatile etch products, and
      (iii) removing at least a portion of the volatile etch products before restarting the etching sequence;
   performing a second treatment on the metal layer after the first etching of the metal layer by exposing the semiconductor substrate to the treatment plasma a second time; and
   etching the metal layer at least one more time with the etching sequence after the second treatment.

16. The method of claim 15, wherein the plurality of times the etching sequence is used in the first etching of the metal layer is 10 to 30 times.

17. The method of claim 15, wherein the halogen-containing precursor reacts with the metal layer in the absence of a reactive plasma.

18. The method of claim 15, wherein the carbon-and-nitrogen-containing precursor reacts with the halogenated etch product in the absence of a reactive plasma.

19. The method of claim 15, wherein the metal comprises cobalt.

20. The method of claim 15, wherein:
   the hydrogen-containing precursor comprises $H_2$ gas;
   the halogen-containing precursor comprises $Cl_2$ gas; and
   the carbon-and-nitrogen-containing precursor comprises tetramethylethylenediamine.

* * * * *